United States Patent
Takeuchi et al.

(10) Patent No.: US 8,421,056 B2
(45) Date of Patent: Apr. 16, 2013

(54) LIGHT-EMITTING DEVICE EPITAXIAL WAFER AND LIGHT-EMITTING DEVICE

(75) Inventors: Takashi Takeuchi, Hitachi (JP); Taichiroo Konnno, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 595 days.

(21) Appl. No.: 12/656,674

(22) Filed: Feb. 12, 2010

(65) Prior Publication Data
US 2010/0224855 A1 Sep. 9, 2010

(30) Foreign Application Priority Data

Mar. 3, 2009 (JP) .................................. 2009-049271
Aug. 10, 2009 (JP) .................................. 2009-185468

(51) Int. Cl.
*H01L 29/06* (2006.01)

(52) U.S. Cl.
USPC ................ 257/13; 257/96; 257/100; 257/103

(58) Field of Classification Search .................... 257/13, 257/98, 100, 103
See application file for complete search history.

(56) References Cited

U.S. PATENT DOCUMENTS

| 2001/0030318 A1 * | 10/2001 | Nakamura et al. ............... 257/13 |
| 2002/0094677 A1 * | 7/2002 | Furuya et al. .................. 438/662 |
| 2009/0194784 A1 * | 8/2009 | Kaji et al. ..................... 257/103 |

FOREIGN PATENT DOCUMENTS

| JP | 7-94780 | 4/1995 |
| JP | 10-270797 | 10/1998 |
| JP | 2000-31597 | 1/2000 |
| JP | 2004-63709 | 2/2004 |
| JP | 2004-241463 | 8/2004 |

* cited by examiner

*Primary Examiner* — Tan N Tran
(74) *Attorney, Agent, or Firm* — McGinn IP Law Group, PLLC

(57) ABSTRACT

A light-emitting device epitaxial wafer includes an n-type substrate, an n-type cladding layer stacked on the n-type substrate, a light-emitting layer including a quantum well structure stacked on the n-type cladding layer, and a p-type cladding layer stacked on the light-emitting layer. The n-type cladding layer includes an epitaxial layer doped with a mixture of 2 or more n-type dopants including Si, and is not less than 250 nm and not more than 750 nm in thickness. Alternatively, a light-emitting device epitaxial wafer includes an n-type substrate, an n-type cladding layer stacked on the n-type substrate, a light-emitting layer stacked on the n-type cladding layer, and a p-type cladding layer stacked on the light-emitting layer. The n-type cladding layer includes 2 or more n-type impurities including Si.

8 Claims, 5 Drawing Sheets

- 9 p-TYPE CURRENT-DISPERSING LAYER
- 8 p-TYPE INTERMEDIATE LAYER
- 7 p-TYPE CLADDING LAYER
- 6 UNDOPED SPACER LAYER
- 5 UNDOPED LIGHT-EMITTING LAYER
- 4 n-TYPE CLADDING LAYER
- 3 LIGHT-REFLECTING LAYER
- 2 n-TYPE BUFFER LAYER
- 1 n-TYPE SUBSTRATE

- 9 p-TYPE CURRENT-DISPERSING LAYER
- 8 p-TYPE INTERMEDIATE LAYER
- 7 p-TYPE CLADDING LAYER
- 6 UNDOPED SPACER LAYER
- 5 UNDOPED LIGHT-EMITTING LAYER
- 4 n-TYPE CLADDING LAYER
- 3 LIGHT-REFLECTING LAYER
- 2 n-TYPE BUFFER LAYER
- 1 n-TYPE SUBSTRATE

| Type | Initial properties | | | | Reliability test | |
|---|---|---|---|---|---|---|
| | Po1 [mW] | Vf1 [V] | Po difference [mW] | Vf difference [V] | ΔPo [%] | ΔVf [V] |
| Comparative Example 1 | 1.48 | 2.08 | -0.06 | 0.41 | 104.1 | 0.16 |
| Comparative Example 2 | 1.39 | 2.04 | -0.09 | 0.45 | 102.3 | 0.13 |
| Comparative Example 3 | 1.04 | 2.10 | -0.15 | 0.03 | 264.3 | 0.24 |
| Example 1 | 1.43 | 2.11 | -0.09 | 0.02 | 101.6 | 0.03 |
| Example 2 | 1.46 | 2.06 | -0.12 | 0.04 | 103.1 | 0.04 |
| Example 3 | 1.35 | 2.05 | -0.08 | 0.02 | 101.5 | 0.02 |
| Example 4 | 1.45 | 2.00 | -0.10 | 0.03 | 100.9 | 0.05 |
| Example 5 | 1.41 | 2.08 | -0.08 | 0.05 | 102.6 | 0.06 |

LIGHT-EMITTING DEVICE EPITAXIAL WAFER AND LIGHT-EMITTING DEVICE

The present application is based on Japanese patent application Nos. 2009-049271 and 2009-185468 filed on Mar. 3, 2009 and Aug. 10, 2009, respectively, the entire contents of which are incorporated herein by reference.

BACKGROUND OF THE INVENTION

1. Field of the Invention

The present invention relates to a light-emitting device epitaxial wafer formed of compound semiconductor crystals, and a light-emitting device.

2. Description of the Related Art

Light-emitting devices formed of compound semiconductor crystals, such as light-emitting diodes (LEDs) produced using an AlGaInP-based epitaxial wafer, are widely used in various applications, such as displays, remote controls, on-vehicle lamps, etc., with increasing luminance.

As a method for growing compound semiconductor crystals, there is metal organic vapor phase epitaxy (MOVPE), molecular beam epitaxy (MBE) or the like.

In the MOVPE, group III organic metal and group V raw material gases are mixed with high-purity hydrogen carrier gas and introduced into a reaction furnace, and pyrolyzed around the substrate heated in the reaction furnace, thereby epitaxially growing the compound semiconductor crystals over the substrate.

In the MBE, a raw material metal is heated in an ultra-high vacuum to produce a molecular beam, to apply the molecular beam to target substrate crystals to grow thin films.

The compound semiconductor epitaxial wafer refers to a wafer with epitaxial layers formed over a compound semiconductor substrate with the above method. As a typical example of the compound semiconductor epitaxial wafer, there is a light-emitting device epitaxial wafer.

The light-emitting device epitaxial wafer is structured by MOVPE, MBE or the like stacking, sequentially on a substrate, an n-type cladding layer, a light-emitting layer, and a p-type cladding layer.

The n-type dopant of the n-type cladding layer uses mainly Te (tellurium), Se (selenium), and Si (silicon). Of these, using Te or Se in epitaxial growth causes Te or Se to remain in a reaction furnace, so that in subsequent growth, the remaining Te or Se is taken into the crystal. This phenomenon is called the memory effect. Experientially, Si causes no memory effect phenomenon.

Refer to JP-A-7-94780, JP-A-2004-241463, JP-A-10-270797, JP-A-2000-31597 and JP-A-2004-63709, for example.

The light-emitting device is presently required to be lower in cost and more stable in performance, because of increasing applications expected and competition with the prior art.

SUMMARY OF THE INVENTION

It is found by the inventors that the use of Te or Se as the n-type dopant causes the n-type dopant to be mixed into an unintended layer (e.g., p-type cladding layer) by the memory effect, thereby having the adverse effect of making operating voltage Vf high. The operating voltage Vf refers to voltage required for causing 20 mA of current to flow in the LED chip to cause the LED chip to emit light. The memory effect occurs relatively strongly at the perimeter of the wafer, thereby making Vf high at the perimeter of the wafer. Therefore, the perimeter of the wafer cannot be used in device production, consequently worsening its chip yield.

On the other hand, using memory effect-free Si as the n-type dopant leads to low light-emitting power Po during initial electrical conduction, and also high Po after electrical conduction, therefore making reliability low.

Accordingly, it is one object of the present invention to provide a light-emitting device epitaxial wafer and a light-emitting device, which allows an enhanced yield, and good reliability.

It is another object of the present invention to provide a light-emitting device epitaxial wafer and a high-reliability light-emitting device, which allows its operating voltage at the perimeter of the wafer to be inhibited from being increased, the in-plane homogeneity of its properties to be enhanced, and its entire wafer surface to be used.

(1) According to one embodiment of the invention, a light-emitting device epitaxial wafer comprises:

an n-type substrate;

an n-type cladding layer stacked on the n-type substrate;

a light-emitting layer comprising a quantum well structure stacked on the n-type cladding layer; and a p-type cladding layer stacked on the light-emitting layer, wherein the n-type cladding layer comprises an epitaxial layer doped with a mixture of 2 or more n-type dopants including Si, and is not less than 250 nm and not more than 750 nm in thickness.

In the above embodiment (1), the following modifications and changes can be made.

(i) The epitaxial layer doped with a mixture of 2 or more n-type dopants including Si is formed to gradually increase the Si concentration from its n-type substrate side to light-emitting layer side, while gradually decreasing the concentration of the n-type dopant other than Si from the n-type substrate side to light-emitting layer side.

(ii) The n-type dopants of the epitaxial layer doped with a mixture of 2 or more n-type dopants including Si are Si and Se, and the amount of Se doping is not less than 20% and not more than 80% relative to the total amount of Si and Se doping.

(2) According to another embodiment of the invention, a light-emitting device epitaxial wafer comprises:

an n-type substrate;

an n-type cladding layer stacked on the n-type substrate;

a light-emitting layer comprising a quantum well structure stacked on the n-type cladding layer; and a p-type cladding layer stacked on the light-emitting layer, wherein the n-type cladding layer comprises an n-type first cladding layer doped with an n-type dopant other than Si, and an n-type second cladding layer doped with Si as an n-type dopant, and the entire thickness of the n-type cladding layer is not less than 250 nm and not more than 750 nm.

In the above embodiment (2), the following modifications and changes can be made.

(iii) The n-type dopant of the n-type first cladding layer is Se, and the Se-doped n-type first cladding layer has not less than 25% and not more than 80% of the total thickness of the n-type cladding layer.

(iv) The light-emitting layer with the quantum well structure comprises an AlGaInP ($0 \leq$ Al mixed crystal ratio $\leq 0.35$) well layer, and the well layer thickness is not less than 2.5 nm and not more than 6.5 nm, and the carrier concentration in the n-type cladding layer is not less than $2.5 \times 10^{17}$ cm$^{-3}$ and not more than $7.0 \times 10^{17}$ cm$^{-3}$.

(v) A light-emitting device produced using the above light-emitting device epitaxial wafer.

(3) According to another embodiment of the invention, a light-emitting device epitaxial wafer comprises:
   an n-type substrate;
   an n-type cladding layer stacked on the n-type substrate;
   a light-emitting layer stacked on the n-type cladding layer; and
   a p-type cladding layer stacked on the light-emitting layer,
   wherein the n-type cladding layer comprises 2 or more n-type impurities including Si.

In the above embodiment (3), the following modifications and changes can be made.

(vi) The n-type cladding layer comprises an epitaxial layer doped with a mixture of 2 or more n-type impurities including Si.

(vii) The n-type impurities are Si and Se, and the amount of Se doping is not less than 20% and not more than 80% relative to the total amount of Si and Se doping.

(viii) The Si concentration in the n-type cladding layer is gradually increased from its n-type substrate side, while the concentration of the n-type impurity other than Si in the n-type cladding layer is gradually decreased from the n-type substrate side, and the carrier concentration in the n-type cladding layer is not less than $3.5 \times 10^{17}$ cm$^{-3}$ and not more than $8.0 \times 10^{17}$ cm$^{-3}$.

(ix) The n-type cladding layer is formed by stacking an n-type first dopant-doped layer doped with an n-type impurity other than Si, and an n-type second dopant-doped layer doped with Si as an n-type impurity on top of the n-type first dopant-doped layer.

(x) The entire thickness of the n-type cladding layer is not less than 750 nm and not more than 1200 nm, and the n-type second dopant-doped layer has not less than 25% and not more than 90% of the entire thickness of the n-type cladding layer.

(xi) A light-emitting device produced using the above light-emitting device epitaxial wafer.

POINTS OF THE INVENTION

According to one embodiment of the invention, the n-type cladding layer comprises 2 or more n-type impurities including Si. This allows the memory effect (which is caused by adding an n-type dopant such as Se, Te, or the like other than Si) to be inhibited by adding Si to together or adjacently forming a Si doped layer, thereby inhibiting the operating voltage at the perimeter of the wafer from being increased, enhancing the in-plane homogeneity of wafer properties, and permitting use of the entire wafer surface. Also, light-emitting power of light-emitting device produced from light-emitting device epitaxial wafer can be stabilized by the n-type impurity other than Si in the n-type cladding layer, thereby permitting high-reliability light-emitting device production.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

First Embodiment

Below is described a first embodiment of a light-emitting device epitaxial wafer according to the invention.

Light-Emitting Device Epitaxial Wafer Construction

Figure 1:
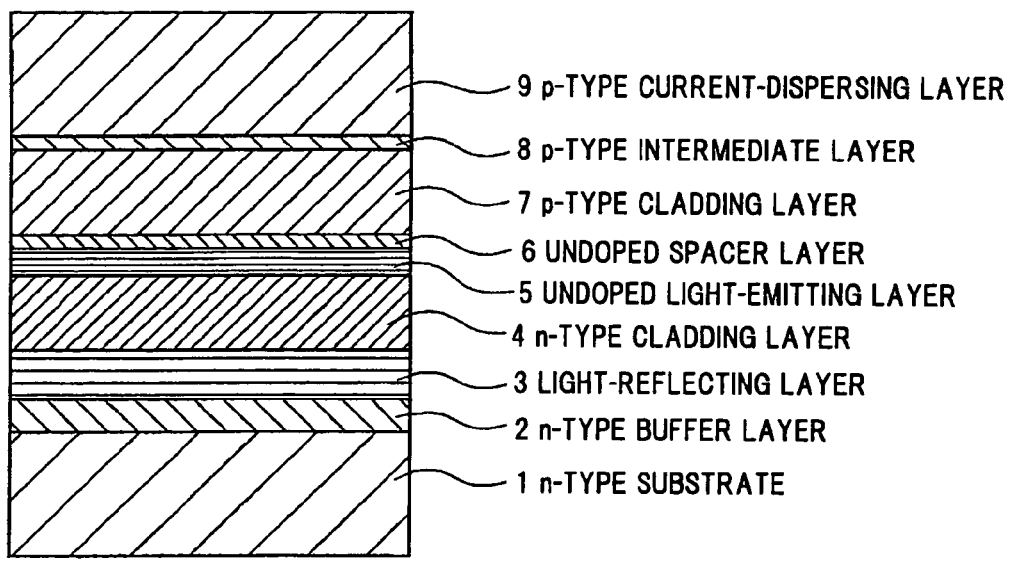
FIG. 1 is a cross-sectional view showing a light-emitting diode epitaxial wafer in a first embodiment according to the invention.

FIG. 1 shows a cross-sectional structure of a light-emitting diode epitaxial wafer in the first embodiment according to the invention.

As shown in FIG. 1, this light-emitting diode epitaxial wafer in the first embodiment is formed by metal organic vapor phase epitaxial growth (MOVPE) stacking, on an n-type substrate 1, an n-type buffer layer 2, a light-reflecting layer 3 laminated with plural pairs of low- and high-refractive index layers, an n-type cladding layer 4, an undoped light-emitting layer 5 with quantum well structure, an undoped spacer layer 6, a p-type cladding layer 7, a p-type intermediate layer 8 for relieving lattice mismatch, and a p-type current-dispersing layer 9.

n-Type Cladding Layer 4

The n-type cladding layer 4 is an epitaxial layer doped with a mixture of 2 or more n-type dopants including Si. As the n-type dopants other than Si, there are Se, Te, etc. The n-type cladding layer 4 is preferably an epitaxial layer doped with a mixture of Si and Se. The n-type cladding layer 4 may also be an epitaxial layer doped with a mixture of 3 or more n-type dopants such as Si and Se and Te.

Doping the n-type cladding layer 4 with an n-type dopant mixture of Si and n-type dopants (Se, Te) other than Si allows easing of the problem with doping with Se (or Te) alone (i.e., the problem of the yield being decreased by the memory effect of Se or Te increasing operating voltage Vf especially at the perimeter of the wafer), and the problem with doping with Si alone (i.e., the problem of low reliability due to low light-emitting power Po during initial electrical conduction, and also high Po after electrical conduction).

When the n-type cladding layer 4 is an epitaxial layer doped with a mixture of Si and Se, the amount of Se doping (i.e., the dopant concentration of Se) is preferably not less than 20% and not more than 80% relative to the total amount of Si and Se doping (i.e., the total dopant concentration of Si and Se) (see later-described FIGS. 2A, 2B and 3 Examples).

The n-type dopants in the n-type cladding layer 4 are distributed to substantially homogeneously mix Si and n-type dopants other than Si.

Figure 2A:
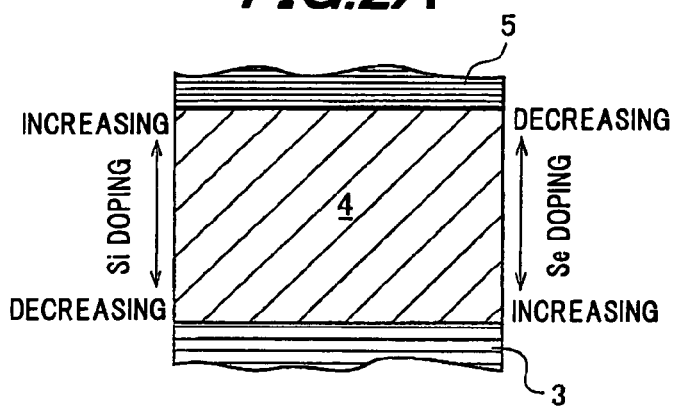
FIG. 2A is a partially enlarged cross-sectional view showing a single-layer n-type cladding layer of the light-emitting diode epitaxial wafer of FIG. 1.

Alternatively, referring to FIG. 2A, the n-type dopants in the n-type cladding layer 4 may be formed to gradually increase the Si concentration from its n-type substrate 1 (light-reflecting layer 3) side to light-emitting layer 5 side, while gradually decreasing the concentration of n-type dopants (Se, Te) other than Si from the n-type substrate 1 (light-reflecting layer 3) side to light-emitting layer 5 side. This formation to gradually decrease the concentration of Se or Te having the memory effect from the n-type substrate 1 (light-reflecting layer 3) side to light-emitting layer 5 side can more reduce the adverse effect of the memory effect due to Se or Te. Further, reversing the concentration distribution of memory effect-free Si relative to that of Se or the like can ensure a necessary carrier concentration in the n-type cladding layer 4.

The n-type cladding layer 4 thickness is preferably not less than 250 nm and not more than 750 nm, from results of experiments and studies. Also, the carrier concentration in the n-type cladding layer 4 is preferably not less than $2.5 \times 10^{17}$ $cm^{-3}$ and not more than $7.0 \times 10^{17}$ $cm^{-3}$.

Figure 2B:
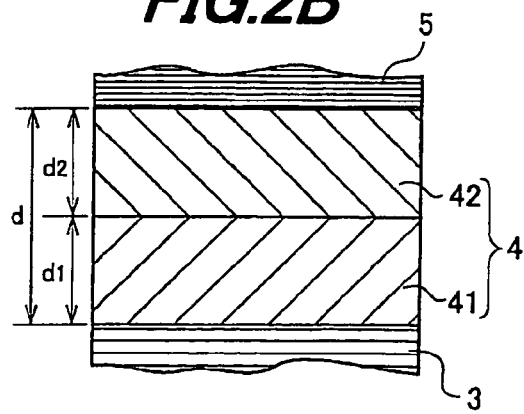
FIG. 2B is a partially enlarged cross-sectional view showing a double-layer n-type cladding layer of the light-emitting diode epitaxial wafer of FIG. 1.

Also referring to FIG. 2B as another embodiment of the n-type cladding layer, the n-type cladding layer 4 may have a double-layer (or plural layer) structure.

In the embodiment shown in FIG. 2B, the n-type cladding layer 4 has the double-layered structure formed by stacking an n-type first cladding layer 41 doped with Se as an n-type dopant other than Si, and an n-type second cladding layer 42 doped with Si as an n-type dopant (the n-type first cladding layer 41 may be a Te-doped layer, or a Se and Te mixture-doped layer).

The double-layered structure of the n-type cladding layer 4 provided with the Se-doped n-type first cladding layer 41 on its n-type substrate 1 (light-reflecting layer 3) side can inhibit operating voltage Vf at the perimeter of the wafer from being increased by the memory effect of Se. Also, it can ease the problem of low light-emitting power during initial electrical conduction and light-emitting power increasing after electrical conduction caused in the case of the single-layer Si-doped n-type cladding layer.

It is preferred that not less than 25% and not more than 80% of the entire thickness (not less than 250 nm and not more than 750 nm) of n-type cladding layer 4 is occupied by the Se-doped n-type first cladding layer 41 (see later-described FIGS. 2A, 2B and 4 Examples).

As described above, doping n-type cladding layer 4 with a mixture of 2 or more n-type dopants including Si, or forming n-type cladding layer 4 from n-type first cladding layer 41 doped with an n-type dopant other than Si, and n-type second cladding layer 42 doped with Si, allows inhibition of the memory effect due to the n-type dopant other than Si, such as Se, Te, or the like. This can inhibit the operating voltage at the perimeter of the wafer from being increased, and thereby enhance the in-plane homogeneity of wafer properties, produce a light-emitting device with good properties from the entire wafer, and enhance its yield. Also, the use of the n-type dopant other than Si, such as Se, Te, or the like can result in the good long-term reliability light-emitting device.

Undoped Light-Emitting Layer 5 with Quantum Well Structure

The undoped light-emitting layer 5 with quantum well structure has an AlGaInP ($0 \leq$ Al mixed crystal ratio $\leq 0.35$) well layer, and the well layer thickness is preferably not less than 2.5 nm and not more than 6.5 nm.

Producing a Light-Emitting Device

A light-emitting device is produced from the light-emitting diode epitaxial wafer as shown in FIG. 1, for example, by forming an n-side electrode on the backside of the n-type substrate 1, and a p-side electrode on the frontside of the p-type current-dispersing layer 9, then dicing the wafer into chips, and mounting each chip to a support such as a stem, thereby resulting in a light-emitting diode.

Although in the above embodiment, the n-type cladding layer 4 has a single-layer structure doped with a mixture of 2 or more n-type dopants including Si, or a double-layered structure formed by stacking an n-type first cladding layer 41 doped with an n-type dopant other than Si, and an n-type second cladding layer 42 doped with Si, it is not limited to these structures, but may have a combination thereof.

For example, the n-type cladding layer 4 may be variously altered to have a double-layered structure formed with a layer doped with a mixture of 2 or more n-type dopants including Si on its n-type substrate 1 side, and a Si-doped n-type second cladding layer on that layer, a triple-layered structure formed with a Se-doped n-type first cladding layer on its n-type substrate 1 side, a layer doped with a mixture of 2 or more n-type dopants including Si on the Se-doped n-type first cladding layer, and a Si-doped n-type second cladding layer thereon, and so on.

Examples of the First Embodiment

Below is described an example of the first embodiment. An LED epitaxial wafer in this example has the same layer structure as the light-emitting diode epitaxial wafer in the first embodiment shown in FIG. 1.

The AlGaInP-based LED epitaxial wafer in this example has formed over an n-type conductive GaAs substrate an n-type GaAs buffer layer (carrier concentration $1 \times 10^{18}$ $cm^{-3}$, thickness 500 nm). Over the buffer layer is formed a light-reflecting layer for serving to reflect light emitted toward the GaAs substrate from a light-emitting layer. The light-reflecting layer comprises alternately laminated high- and low-refractive index films each having ¼-wavelength thickness. In this example are grown 5 pairs of $Al_{0.85}Ga_{0.15}As$ and GaAs. Over the light-reflecting layer is formed an n-type $(Al_{0.68}Ga_{0.32})_{0.51}In_{0.49}P$ cladding layer (carrier concentration $5.5 \times 10^{17}$ $cm^{-3}$, thickness 500 nm). The light-emitting layer formed over the n-type cladding layer has quantum well structure with 15 pairs of $(Al_{0.55}Ga_{0.45})_{0.51}In_{0.49}P$ layer (barrier layer, thickness 6.5 nm) and $Ga_{0.51}In_{0.49}P$ (well layer, thickness 4.0 nm) stacked from the GaAs substrate side thereof. The light-emitting layer is undoped. Over the light-emitting layer is formed an undoped $(Al_{0.5}Ga_{0.5})_{0.51}In_{0.49}P$ spacer layer (thickness 300 nm). Over the spacer layer is formed a Mg-doped p-type $(Al_{0.7}Ga_{0.3})_{0.51}In_{0.49}P$ cladding layer (carrier concentration $3 \times 10^{17}$ $cm^{-3}$, thickness 800 nm). Over the p-type cladding layer is formed an intermediate layer for relieving a lattice mismatch between the p-type cladding layer and a current-dispersing layer (contact layer). The intermediate layer is formed of a Zn-doped p-type $(Al_{0.15}Ga_{0.85})_{0.51}In_{0.49}P$ (carrier concentration $1.0 \times 10^{18}$ $cm^{-3}$, thickness 300 nm). At the top is formed the Zn-doped p-type GaP current-dispersing layer (carrier concentration $2.0 \times 10^{18}$ $cm^{-3}$, thickness 9 μm).

The method used for forming the epitaxial layers of the LED epitaxial wafer is MOVPE. Namely, necessary group III organic metal, group V and dopant raw material gases are mixed with high-purity hydrogen carrier gas and introduced into a reaction furnace, and pyrolyzed around the GaAs substrate heated in the reaction furnace, thereby growing the epitaxial layers over the GaAs substrate. For epitaxial growth, the example uses TMG (trimethyl gallium) as Ga raw material, TMA (trimethyl aluminum) as Al raw material, TMI (trimethyl indium) as In raw material, $AsH_3$ (arsine) as As raw material, $PH_3$ (phosphine) as P raw material, $Si_2H_6$ (disilane) as Si n-type dopant raw material, likewise $H_2Se$ (hydrogen selenide) as Se raw material, and DETe (diethyltellurium) as Te raw material. The example also uses $Cp_2Mg$ (biscyclopentadienyl magnesium) as Mg p-type dopant raw material, and DEZ (diethyl zinc) as Zn raw material.

With this example, LED epitaxial wafers in Examples 1-5 and Comparative examples 1-3 are produced that have the following n-type cladding layer structures, respectively.

Comparative Examples 1-3

In Comparative examples 1-3 are produced the wafers with a single-layer n-type cladding layer (carrier concentration $5.5 \times 10^{17}$ cm$^{-3}$, thickness 500 nm), using the following n-type dopants, respectively, for the single-layer n-type cladding layer:
(1) Se (Comparative example 1)
(2) Te (Comparative example 2)
(3) Si (Comparative example 3)

Examples 1-5 of the First Embodiment (4) In Example 1 is produced the wafer with a single-layer n-type cladding layer (carrier concentration $5.5 \times 10^{17}$ cm$^{-3}$, thickness 500 nm) codoped with Se and Si n-type dopants such that Se and Si doping ratio (i.e., the ratio of Se concentration and Si concentration in the single-layer n-type cladding layer) is Se:Si=2:1.
(5) In Example 2 is produced the wafer with a single-layer n-type cladding layer (carrier concentration $5.5 \times 10^{17}$ cm$^{-3}$, thickness 500 nm) codoped with Te and Si n-type dopants such that Te and Si doping ratio (i.e., the ratio of Te concentration and Si concentration in the single-layer n-type cladding layer) is Te:Si=2:1.
(6) In Example 3 is produced the wafer with a double-layer n-type cladding layer formed by growing a Se-doped $(Al_{0.68}Ga_{0.32})_{0.51}In_{0.49}P$ layer (carrier concentration $5.5 \times 10^{17}$ cm$^{-3}$, thickness 250 nm), and thereover a Si-doped $(Al_{0.68}Ga_{0.32})_{0.51}In_{0.49}P$ layer (carrier concentration $5.5 \times 10^{17}$ cm$^{-3}$, thickness 250 nm).
(7) In Example 4 is produced the wafer with a double-layer n-type cladding layer formed by growing a Te-doped $(Al_{0.68}Ga_{0.32})_{0.51}In_{0.49}P$ layer (carrier concentration $5.5 \times 10^{17}$ cm$^{-3}$, thickness 250 nm), and thereover a Si-doped $(Al_{0.68}Ga_{0.32})_{0.51}In_{0.49}P$ layer (carrier concentration $5.5 \times 10^{17}$ cm$^{-3}$, thickness 250 nm).
(8) In Example 5 is produced the wafer with a single-layer n-type cladding layer (carrier concentration $5.5 \times 10^{17}$ cm$^{-3}$, thickness 500 nm) grown by varying the supply of n-type dopant raw material gases from its GaAs substrate side to light-emitting layer side, $H_2Se$ from 93 ccm (initial growth) to 0 ccm (final growth) and $Si_2H_6$ from 0 ccm (initial growth) to 176 ccm (final growth).

The amount of each of the n-type dopant raw material gasses fed is determined in consideration of the target n-type dopant concentration (and the carrier concentration in the n-type semiconductor layer) and the doping efficiency of each of the raw materials.

LED chips are produced from the LED epitaxial wafers in Comparative examples 1-3 and Examples 1-5, and the properties of the LED chips are measured. The properties of the LED chips obtained are shown by (i)-(vi) below. The results of measuring the properties of the LED chips are shown in FIG. 3.

(i) Po1 [mW]: light-emitting power during initial electrical conduction
(ii) Vf1 [V]: operating voltage during initial electrical conduction
(iii) Po2 [mW]: light-emitting power after 240 hour electrical conduction
(iv) Vf2 [V]: operating voltage after 240 hour electrical conduction
(v) ΔPo [%]=Po2/Po1×100: ratio of light-emitting power Po2 [mW] after 240 hour electrical conduction to light-emitting power Po1 [mW] during initial electrical conduction
(vi) ΔVf [V]=Vf2−Vf1: change with time of operating voltage expressed by subtracting operating voltage Vf1 during initial electrical conduction from operating voltage Vf2 after 240 hour electrical conduction (i) and (ii) are the initial properties, and (v) and (vi) are the properties showing reliability. The closer ΔPo to 100%, the higher the reliability, while the smaller ΔVf, the higher the reliability. It is preferable that ΔPo is within a range of 95-110%, and that ΔVf is within a range of ±0.1V. The operating voltage refers to voltage required for causing 20 mA of current to flow in the LED chip to cause the LED chip to emit light.

Also examined is the in-plane homogeneity of the epitaxial wafers in Comparative examples 1-3 and Examples 1-5. For each LED epitaxial wafer in Comparative examples 1-3 and Examples 1-5, chips are produced from a wafer middle portion and from a 3 mm inner portion from the wafer edge (a wafer edge portion), and light-emitting power Po1 during initial electrical conduction and operating voltage Vf1 during initial electrical conduction in the wafer middle portion and the wafer edge portion are measured. The in-plane homogeneity properties of the epitaxial wafers obtained are shown by (vii) and (viii) below. The results of measuring the in-plane homogeneity properties of the epitaxial wafers are shown in FIG. 3.

(vii) Po difference: light-emitting power difference by subtracting light-emitting power Po1 during initial electrical conduction of the chip in the wafer middle portion from light-emitting power Po1 during initial electrical conduction of the chip in the wafer edge portion
(viii) Vf difference: operating voltage difference by subtracting operating voltage Vf1 during initial electrical conduction of the chip in the wafer middle portion from operating voltage Vf1 during initial electrical conduction of the chip in the wafer edge portion The smaller the Po difference and Vf difference, the better the in-plane homogeneity of the properties. The previously-mentioned ΔPo and ΔVf are measured of the chip in the wafer middle portion.

Figures 3, 4:
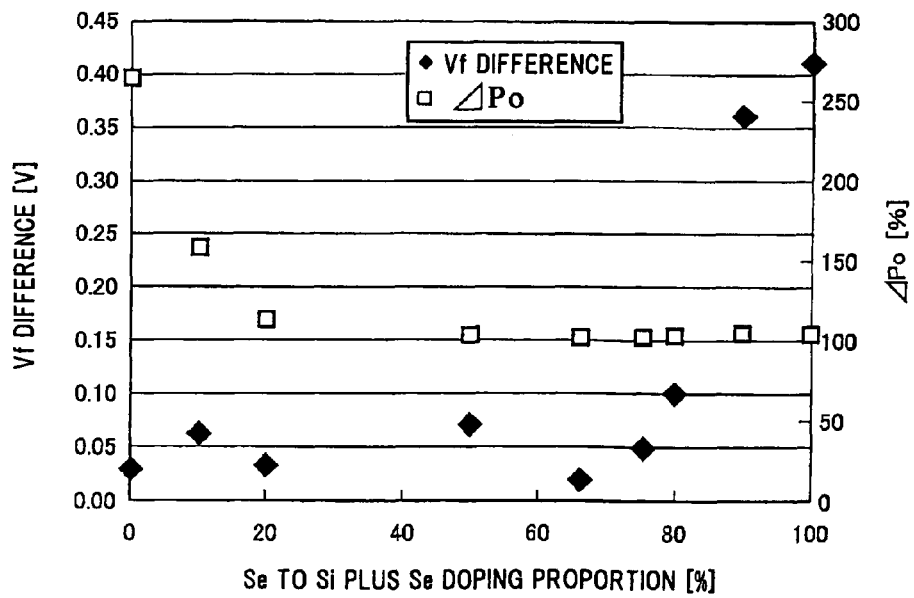
FIG. 3 is a diagram showing properties of light-emitting diode epitaxial wafers in Examples of the first embodiment and in Comparative examples.
FIG. 4 is a graph showing the relationships between the Se to Si plus Se doping proportion, and Vf difference, and ΔPo, in Example 1 of the first embodiment.

Referring to FIG. 3, Comparative example 1 (100% Se doping) and Comparative example 2 (100% Te doping) show the Vf difference as high as 0.41 V and 0.45 V, respectively, therefore having poor in-plane homogeneity. Also, Comparative example 3 (100% Si doping) shows ΔPo as very large as 264.3%, and also ΔVf as large as 0.24 V, therefore having low reliability. In contrast, it is found that Examples 1-5 show the Vf difference 0.02-0.05 V, which are all as small as not more than 0.1 V, therefore having substantially enhanced in-plane homogeneity of Vf. Also, Examples 1-5 show ΔPo 100.9-103.1%, and also ΔVf 0.02-0.06 V, therefore having good reliability. The other properties of Examples 1-5 obtained can be equal to or better than those of Comparative examples 1-3.

In Example 1 (Se-and-Si-codoped single-layer n-type cladding layer), the Se and Si proportion is varied. FIG. 4 shows the results of the Vf difference and ΔPo when varying the doping proportion [%] defined as the amount of Se doping (i.e., the dopant concentration of Se) relative to the total amount of Se and Si doping (i.e., the total dopant concentration of Si and Se).

When the doping proportion of Se to the total of Se and Si is less than 20%, ΔPo is large, and when the Se doping proportion exceeds 80%, the Vf difference is large. Accordingly, in the Se and Si mixture doping, the Vf difference and ΔPo both are good when the doping proportion of Se to the total of Se and Si is not less than 20% and not more than 80%.

Also, from FIGS. 3 and 4, it may be assumed that when in Example 2 (Te-and-Si-codoped single-layer n-type cladding layer) the Te and Si proportion is varied, similar results are obtained.

In Example 3 (double-layer n-type cladding layer with a Se-doped $(Al_{0.68}Ga_{0.32})_{0.51}In_{0.49}P$ layer (carrier concentration $5.5 \times 10^{17}$ cm$^{-3}$, thickness 250 nm), and a Si-doped $(Al_{0.68}Ga_{0.32})_{0.51}In_{0.49}P$ layer (carrier concentration $5.5 \times 10^{17}$ cm$^{-3}$, thickness 250 nm)), the thickness of the Se-doped $(Al_{0.68}Ga_{0.32})_{0.51}In_{0.49}P$ layer is varied with the total thickness of the n-type cladding layer held at 500 nm.

When the thickness of the Se-doped $(Al_{0.68}Ga_{0.32})_{0.51}In_{0.49}P$ layer is less than 125 nm, ΔPo is large, and when the thickness of the Se-doped $(Al_{0.68}Ga_{0.32})_{0.51}In_{0.49}P$ layer exceeds 400 nm, the Vf difference is large. The Vf difference and ΔPo both are good when the thickness of the Se-doped $(Al_{0.68}Ga_{0.32})_{0.51}In_{0.49}P$ layer is not less than 125 nm and not more than 400 nm (when the Se-doped $(Al_{0.68}Ga_{0.32})_{0.51}In_{0.49}P$ layer has not less than 25% and not more than 80% of the total thickness of the n-type cladding layer). Further, it is more preferable that the Se-doped layer thickness is not less than 125 nm and not more than 350 nm (the Se-doped n-type first cladding layer thickness is not less than 25% and not more than 70% of the total thickness of the n-type cladding layer).

Figure 5:
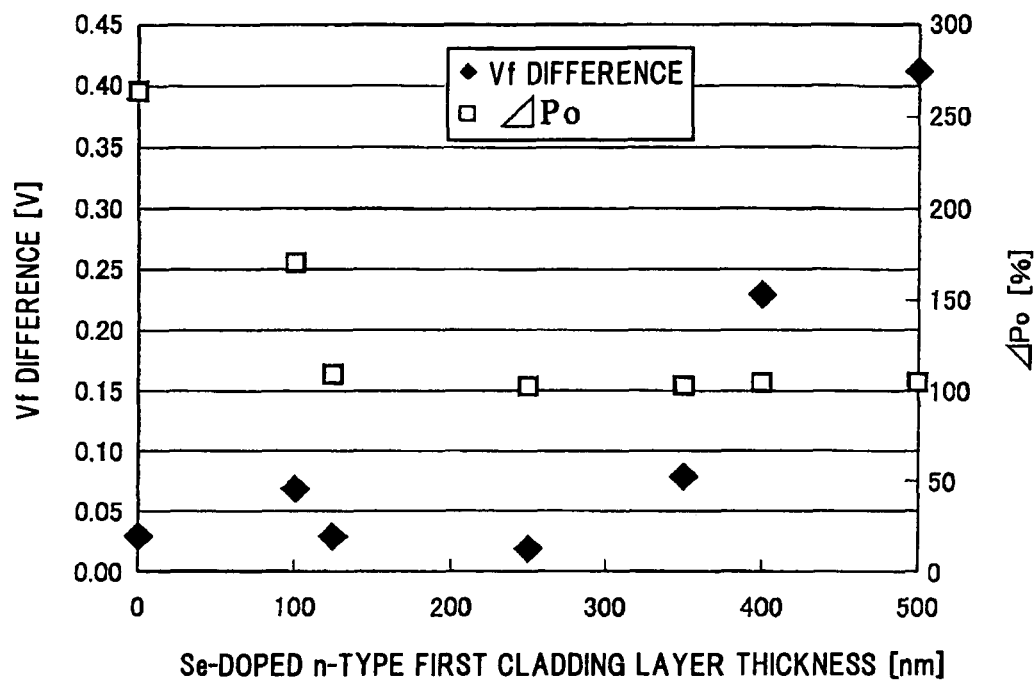
FIG. 5 is a graph showing the relationships between the thickness of a Se-doped n-type first cladding layer in an n-type cladding layer, and Vf difference, and ΔPo, in Example 3 of the first embodiment.

Also, from FIGS. 3 and 5, it may be assumed that in Example 4 with the Te-doped layer and the Si-doped layer stacked therein, similar results are obtained.

In the above Example, the light-emitting layer of the LED epitaxial wafer has quantum well structure with 15 pairs of $(Al_{0.55}Ga_{0.45})_{0.51}In_{0.49}P$ layer (barrier layer, thickness 6.5 nm) and $Ga_{0.51}In_{0.49}P$ (well layer, thickness 4.0 nm) stacked from the GaAs substrate side thereof. The well layer is doped with Al to form an AlGaInP layer, and its Al mixed crystal ratio is varied to substantially 0.35, and the well layer thickness is varied to substantially 2.5-6.5 nm. That is, it is found that when the light-emitting wavelength of the light-emitting layer is varied, similar results are obtained. The number of pairs in the quantum well structure of the light-emitting layer is not limited to 15 pairs.

Second Embodiment

Below is described a second embodiment of a light-emitting device epitaxial wafer according to the invention.

Light-Emitting Device Epitaxial Wafer Construction

Figure 6:
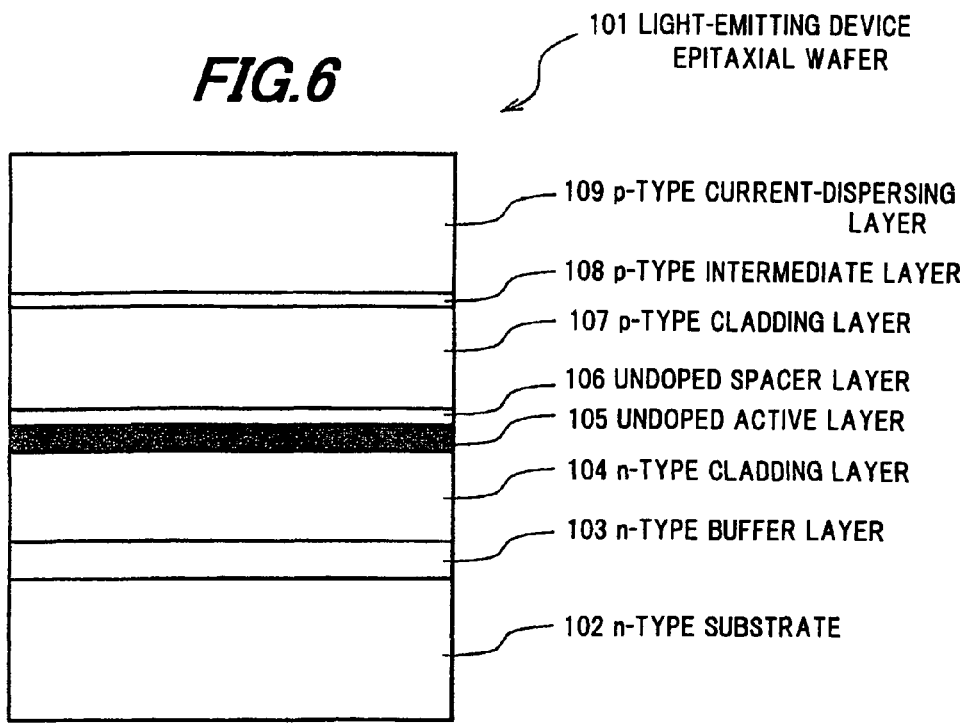
FIG. 6 is a cross-sectional view showing a light-emitting diode epitaxial wafer in a second embodiment according to the invention.

FIG. 6 shows a cross-sectional structure of a light-emitting device epitaxial wafer in a second embodiment according to the invention. Herein is described an LED epitaxial wafer.

As shown in FIG. 6, this light-emitting device epitaxial wafer 101 in the second embodiment is formed by stacking, sequentially on an n-type substrate 102, a buffer layer 103, an n-type cladding layer 104, a light-emitting layer 105, a spacer layer 106, a p-type cladding layer 107, an intermediate layer 108, and a current-dispersing layer 109.

The n-type substrate 102 is an underlying compound semiconductor crystal and is formed of a conductive GaAs substrate. The buffer layer 103 is a layer for relieving a lattice mismatch between the n-type substrate 102 and the n-type cladding layer 104 and is formed of n-type GaAs.

The n-type cladding layer 104 is formed of n-type AlGaInP, and the p-type cladding layer 107 is formed of p-type AlGaInP. These are high band gap energy semiconductor layers formed adjacent to or in close contact with the active layer 105.

The active layer 105 is the light-emitting layer and is formed of undoped AlGaInP. The spacer layer 106 serves to suppress the ion scattering of free electrons of the active layer 105, and is formed of undoped AlGaInP with a high Al composition ratio.

The intermediate layer 108 is a layer for relieving a lattice mismatch between the p-type cladding layer 107 and the current-dispersing layer 109 and is formed of p-type AlGaInP. The current-dispersing layer 109 is a layer for dispersing current in the chip surface direction for widening the light-emitting area, and is formed of p-type GaP.

The light-emitting device epitaxial wafer 101 in the second embodiment is characterized in that the n-type cladding layer 104 is formed by using 2 or more n-type impurities including Si.

Namely, the n-type cladding layer 104 is formed of an epitaxial layer doped with a mixture of 2 or more n-type impurities including Si. The n-type impurities use Te or Se besides Si. This n-type cladding layer 104 has a carrier concentration of not less than $3.5 \times 10^{17}$ cm$^{-3}$ and not more than $8.0 \times 10^{17}$ cm$^{-3}$, and a thickness of not less than 750 nm and not more than 1200 nm.

For example, when doping with a mixture of Si and Se as the n-type impurities, the amount of Se doping (i.e., the dopant concentration of Se) is not less than 20% and not more than 80% relative to the total amount of Si and Se doping (i.e., the total dopant concentration of Si and Se). This is because the amount of Se doping less than 20% relative to the total amount of Si and Se doping fails to ensure stable light-emitting power of light-emitting device produced, therefore leading to low reliability, while the amount of Se doping exceeding 80% relative to the total amount of Si and Se doping worsens in-plane homogeneity of operating voltage.

Functions and effects of this light-emitting device epitaxial wafer 101 are explained.

Conventionally, it is known that the use of Te or Se as the n-type impurities of the n-type cladding layer 104 causes the memory effect. Si has no memory effect, but doping with Si alone causes the light-emitting power of the device chip to be varied by electrical conduction, therefore worsening its reliability.

In contrast, the light-emitting device epitaxial wafer 101 is doped with a mixture of memory effect-free Si, and Se or Te with good doping efficiency as the n-type impurities of the n-type cladding layer 104.

This allows the memory effect to be inhibited by Si, thereby inhibiting the operating voltage at the perimeter of the wafer from being increased, enhancing the in-plane homogeneity of wafer properties, and permitting use of the entire wafer. Also, stable light-emitting power of light-emitting device produced from light-emitting device epitaxial wafer 101 can be ensured by Se or Te, thereby permitting high-reliability light-emitting device production.

Next is described another second embodiment.

A light-emitting device epitaxial wafer in this embodiment is basically the same as light-emitting device epitaxial wafer 101 in the second embodiment, except that the n-type impurities in the n-type cladding layer 104 are formed to gradually increase the Si concentration from its n-type substrate 102 side, while gradually decreasing the concentration of n-type impurities other than Si from the n-type substrate 102 side, and the carrier concentration in the n-type cladding layer is not less than $3.5 \times 10^{17}$ cm$^{-3}$ and not more than $8.0 \times 10^{17}$ cm$^{-3}$, and the thickness of the n-type cladding layer 104 is not less than 750 nm and not more than 1200 nm. The n-type impurity other than Si uses Se or Te, as in the second embodiment.

More specifically, the concentration of the n-type impurity other than Si in the n-type cladding layer 104 is varied from 100% at its n-type substrate 102 side to 0% at light-emitting layer 105 side, while the Si concentration is reversely varied from 0% to 100%. The n-type impurities (dopants) are doped such that the n-type cladding layer has a desired carrier concentration.

For example, when the Se carrier concentration is $7.5 \times 10^{17}$ cm$^{-3}$ at 100 ccm, and the Si carrier concentration is $7.5 \times 10^{17}$ cm$^{-3}$ at 200 ccm, the Se carrier concentration is gradually varied from 100 ccm at the start of n-type cladding layer 104 growing to 0 ccm during the n-type cladding layer 104 growing, while the Si concentration is gradually varied from 0 ccm at the start of n-type cladding layer 104 growing to 200 ccm during the n-type cladding layer 104 growing.

Thus, just before the end of the n-type cladding layer 104 growing, no n-type impurity other than Si is supplied. This eliminates the fear that the n-type impurity is taken into the subsequently formed layer.

Also, doping the n-type cladding layer 104 with Se or Te with good doping efficiency can ensure stable light-emitting power of light-emitting device produced, therefore enhancing its reliability.

Accordingly, the light-emitting device epitaxial wafer in this embodiment can inhibit the operating voltage at the perimeter of the wafer from being increased, enhance the in-plane homogeneity of wafer properties, permit use of the entire wafer surface, and permit high-reliability light-emitting device production, as in the second embodiment.

Further is described another second embodiment.

A light-emitting device epitaxial wafer in this embodiment has an n-type cladding layer with a double-layer structure.

Specifically, the n-type cladding layer is formed by stacking an n-type first dopant-doped layer doped with an n-type impurity (Se or Te) other than Si, and an n-type second dopant-doped layer doped with Si as an n-type impurity on top of the n-type first dopant-doped layer.

It is preferred that the entire thickness of the n-type cladding layer is not less than 750 nm and not more than 1200 nm, and that the n-type second dopant-doped layer has not less than 25% and not more than 90% of the entire thickness of the n-type cladding layer. This is because the n-type second dopant-doped layer thickness less than 25% relative to the entire thickness of the n-type cladding layer fails to ensure stable light-emitting power of light-emitting device produced, therefore leading to low reliability, while the n-type second dopant-doped layer thickness exceeding 90% worsens in-plane homogeneity of operating voltage.

Since the light-emitting device epitaxial wafer in this embodiment is doped with memory effect-free Si in the upper layer of the n-type cladding layer, i.e., the n-type second dopant-doped layer as the n-type impurity, there is no fear that the n-type impurity is taken into the layer formed after the n-type cladding layer is grown.

Accordingly, the light-emitting device epitaxial wafer in this embodiment can inhibit the operating voltage at the perimeter of the wafer from being increased, enhance the in-plane homogeneity of wafer properties, permit use of the entire wafer surface, and permit high-reliability light-emitting device production, as in the second embodiment.

Next is described a light-emitting device according to the invention.

This light-emitting device according to the invention is produced by using the light-emitting device epitaxial wafers in the above embodiments.

This light-emitting device has stable light-emitting power, and therefore excellent reliability because of using the light-emitting device epitaxial wafers of the invention whose n-type cladding layer 104 is formed by using 2 or more n-type impurities including Si.

Examples of the Second Embodiment

The reason for the invention is explained by way of an example of the second embodiment.

First, group III organic metal and group V raw material gases are mixed with high-purity hydrogen carrier gas and introduced into a reaction furnace, and pyrolyzed around a substrate heated in the reaction furnace, thereby metal-organic-vapor-phase-epitaxy growing over the substrate an LED epitaxial structure as shown in Table 1 below.

TABLE 1

| Layer name | Crystal | Thickness | Carrier concentration |
|---|---|---|---|
| Current-dispersing layer | p-GaP | 9 μm | $4 \times 10^{18}$ cm$^{-3}$ |
| Intermediate layer | p-$(Al_{0.15}Ga_{0.85})_{0.51}In_{0.49}P$ | 100 nm | $1 \times 10^{18}$ cm$^{-3}$ |
| p-type cladding layer | p-$(Al_{0.7}Ga_{0.3})_{0.51}In_{0.49}P$ | 800 nm | $3 \times 10^{17}$ cm$^{-3}$ |
| Spacer layer | Undoped $(Al_{0.5}Ga_{0.5})_{0.51}In_{0.49}P$ | 300 nm | — |
| Active layer | Undoped $(Al_{0.1}Ga_{0.9})_{0.51}In_{0.49}P$ | 650 nm | — |
| n-type cladding layer | n-$(Al_{0.68}Ga_{0.32})_{0.51}In_{0.49}P$ | 1000 nm | $7.5 \times 10^{17}$ cm$^{-3}$ |
| Buffer layer | n-GaAs | 500 nm | $1 \times 10^{18}$ cm$^{-3}$ |
| Substrate | Conductive GaAs substrate |  | $1 \times 10^{18}$ cm$^{-3}$ |

Herein, n- and p-type are denoted by n- and p-, respectively.

For epitaxial growth, the example uses TMG (trimethyl gallium) as Ga raw material, TMA (trimethyl aluminum) as Al raw material, TMI (trimethyl indium) as In raw material, AsH$_3$ (arsine) as As raw material, PH$_3$ (phosphine) as P raw material, Si$_2$H$_6$ (disilane) as Si n-type impurity raw material, likewise H$_2$Se (hydrogen selenide) as Se raw material, and DETe (diethyltellurium) as Te raw material. The example also uses Cp$_2$Mg (biscyclopentadienyl magnesium) as Mg p-type impurity raw material, and DEZ (diethyl zinc) as Zn raw material.

Over an n-type substrate (n-type conductive GaAs substrate) 102 is grown an n-type GaAs buffer layer 103 (carrier concentration $1\times10^{18}$ cm$^{-3}$, thickness 500 nm). Over the buffer layer 103 is grown an n-type $(Al_{0.68}Ga_{0.32})_{0.51}In_{0.49}P$ cladding layer 104 (carrier concentration $7.5\times10^{17}$ cm$^{-3}$, thickness 1000 nm). Over the cladding layer 104 is grown an undoped $(Al_{0.1}Ga_{0.9})_{0.51}In_{0.49}P$ light-emitting layer 105 (thickness 650 nm). Over the light-emitting layer 105 is grown a $(Al_{0.15}Ga_{0.85})_{0.51}In_{0.49}P$ spacer layer 106 (thickness 300 nm).

Over the spacer layer 106 is grown a Mg-doped p-type $(Al_{0.7}Ga_{0.3})_{0.51}In_{0.49}P$ cladding layer 107 (carrier concentration $3\times10^{17}$ cm$^{-3}$, thickness 800 nm). Over the cladding layer 107 is grown an intermediate layer 108 for relieving a lattice mismatch between the p-type cladding layer 107 and current-dispersing layer (contact layer) 109. The intermediate layer 108 is formed of a Zn-doped p-type $(Al_{0.15}Ga_{0.85})_{0.51}In_{0.49}P$ (carrier concentration $1.0\times10^{18}$ cm$^{-3}$, thickness 300 nm). At the top is grown the Zn-doped p-type GaP current-dispersing layer 109 (carrier concentration $2.0\times10^{18}$ cm$^{-3}$, thickness 9 μm).

Herein are grown LED epitaxial wafers in Examples 1-5 of the second embodiment and Comparative examples 1-3 below. The LED epitaxial wafers in Examples 1-5 of the second embodiment and Comparative examples 1-3 are 4-inch size.

Comparative Examples 1-3

In Comparative examples 1-3 are produced the wafers using Se (Comparative example 1), Te (Comparative example 2), and Si (Comparative example 3), respectively, as the n-type impurity of the n-type cladding layer.

Examples 1-5 of the Second Embodiment

In Example 1 is produced the wafer with an n-type cladding layer 104 codoped with Se and Si n-type impurities such that Se and Si doping ratio (i.e., the ratio of Se concentration and Si concentration in the n-type cladding layer 104) is Se:Si=2:1. In Example 2 is produced the wafer with an n-type cladding layer 104 codoped with Te and Si n-type dopants such that Te and Si doping ratio (i.e., the ratio of Te concentration and Si concentration in the n-type cladding layer 104) is Te:Si=2:1. In Example 3 is produced the wafer with a Se-doped $(Al_{0.68}Ga_{0.32})_{0.51}In_{0.49}P$ layer (carrier concentration $7.5\times10^{17}$ cm$^{-3}$, thickness 500 nm), and thereover a Si-doped $(Al_{0.68}Ga_{0.32})_{0.51}In_{0.49}P$ layer (carrier concentration $7.5\times10^{17}$ cm$^{-3}$, thickness 500 nm) grown as the n-type cladding layer. In Example 4 is produced the wafer with a Te-doped $(Al_{0.68}Ga_{0.32})_{0.51}In_{0.49}P$ layer (carrier concentration $7.5\times10^{17}$ cm$^{-3}$, thickness 500 nm), and thereover a Si-doped $(Al_{0.68}Ga_{0.32})_{0.51}In_{0.49}P$ layer (carrier concentration $7.5\times10^{17}$ cm$^{-3}$, thickness 500 nm) grown as the n-type cladding layer. In Example 5 is produced the wafer with an n-type cladding layer that is grown by gradually varying the amount of Se dopant raw material gas fed from 125 ccm (at the start of the n-type cladding layer growth) to 0 ccm and the amount of Si dopant raw material gas fed from 0 ccm (at the start of the n-type cladding layer growth) to 241 ccm such that the n-type cladding layer has a carrier concentration of $7.9\times10^{17}$ cm$^{-3}$ and an entire thickness of 1000 nm. The amount of each of the n-type dopant raw material gasses fed is determined in consideration of the target n-type dopant concentration (and the carrier concentration in the n-type semiconductor layer) and the doping efficiency of each of the raw materials.

LED chips are produced from the LED epitaxial wafers in Examples 1-5 and Comparative examples 1-3, and the properties of the LED chips are compared. The properties of the LED chips compared are: (i) Po1 [mW]: light-emitting power during initial electrical conduction; (ii) Vf1 [V]: operating voltage during initial electrical conduction; (iii) Po2 [mW]: light-emitting power after 240 hour electrical conduction; and (iv) Vf2 [V]: operating voltage after 240 hour electrical conduction. Also, (v) ΔPo [%] is the ratio of light-emitting power Po2 [mW] after 240 hour electrical conduction to light-emitting power Po1 [mW] during initial electrical conduction, and (vi) ΔVf [V] is the change with time of operating voltage expressed by subtracting operating voltage Vf1 during initial electrical conduction from operating voltage Vf2 after 240 hour electrical conduction.

(i) and (ii) are the initial properties, and (v) and (vi) are the properties showing reliability. The closer ΔPo to 100%, the higher the reliability, while the smaller ΔVf, the higher the reliability.

For each LED epitaxial wafer in Examples 1-5 and Comparative examples 1-3, chips are produced from a wafer middle portion and from a 3 mm inner portion from the wafer edge. The light-emitting power difference between the wafer middle portion and the 3 mm inner portion from the wafer edge is referred to as Po difference (=3-mm-from-wafer-edge value−wafer-middle value). Likewise, the operating voltage difference therebetween is referred to as Vf difference.

The smaller the Po difference and Vf difference, the better the in-plane homogeneity of the properties. The previously-mentioned ΔPo and ΔVf are measured in the wafer middle portion.

Table 2 below shows the properties of the LED chips produced in Examples 1-5 of the second embodiment and Comparative examples 1-3.

TABLE 2

| | Initial properties | | | | Reliability test | | |
|---|---|---|---|---|---|---|---|
| | Po1 [mW] | Vf1 [V] | Po difference [mW] | Vf difference [V] | ΔPo [%] | ΔVf [V] | Note |
| Example 1 | 1.08 | 1.89 | −0.09 | 0.04 | 102.4 | 0.02 | Invention |
| Example 2 | 1.06 | 1.92 | −0.11 | 0.04 | 104.3 | 0.06 | |
| Example 3 | 1.12 | 1.19 | −0.06 | 0.02 | 103.2 | 0.05 | |
| Example 4 | 1.08 | 1.88 | −0.13 | 0.06 | 101.8 | 0.07 | |
| Example 5 | 1.11 | 1.93 | −0.07 | 0.01 | 103.7 | 0.05 | |
| Comparative example 1 | 1.10 | 1.90 | −0.08 | 0.35 | 105.3 | 0.18 | Prior art |
| Comparative example 2 | 1.04 | 1.86 | −0.13 | 0.42 | 102.0 | 0.10 | |
| Comparative example 3 | 0.41 | 1.88 | −0.16 | 0.05 | 256.1 | 0.23 | |

Comparative examples 1 and 2 show the Vf difference as high as 0.35 V and 0.42 V, respectively. Also, Comparative example 3 shows ΔPo as very large as 256.1%. In contrast, it is found that Examples 1-5 of the second embodiment show the Vf difference as small as 0.01-0.06 V, therefore having substantially enhanced in-plane distribution of Vf. Also, Examples 1-5 show ΔPo 101.8-104.3%, therefore having no problem with reliability. The other properties of Examples 1-5 obtained can be equal to or better than those of Comparative examples 1-3.

Figure 7:
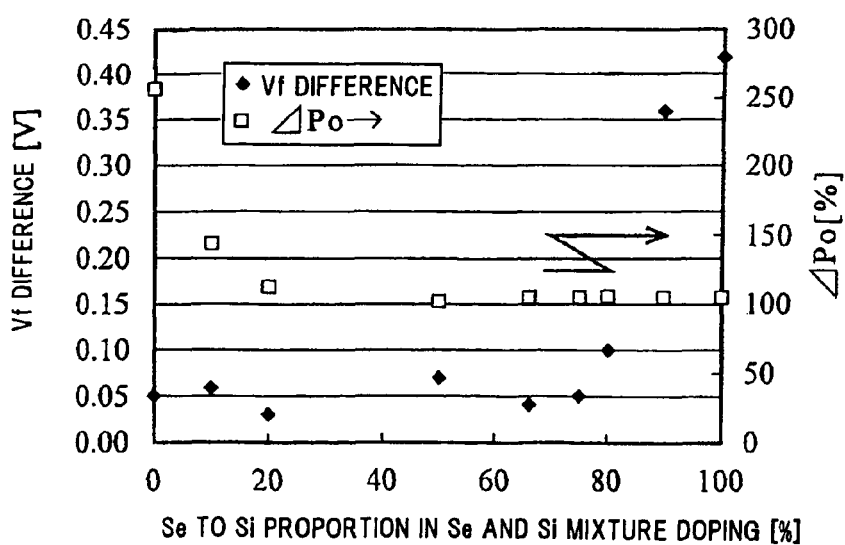
FIG. 7 is a graph showing the relationships between the Se to Si proportion in Se and Si mixture doping, and Vf difference, and ΔPo, in Example 1 of the second embodiment.

FIG. 7 shows the results of the Vf difference and ΔPo when varying the Se and Si proportion in Example 1 of the second embodiment.

As shown in FIG. 7, in the Se and Si mixture doping, the Vf difference and ΔPo both are good when the doping proportion of the amount of Se doping (i.e., the dopant concentration of Se) relative to the total amount of Se and Si (i.e., the total dopant concentration of Se and Si) is not less than 20% and not more than 80%. From this result, it may be assumed that when in Example 2 of the second embodiment the Te and Si proportion is varied, similar results are obtained.

Figure 8:
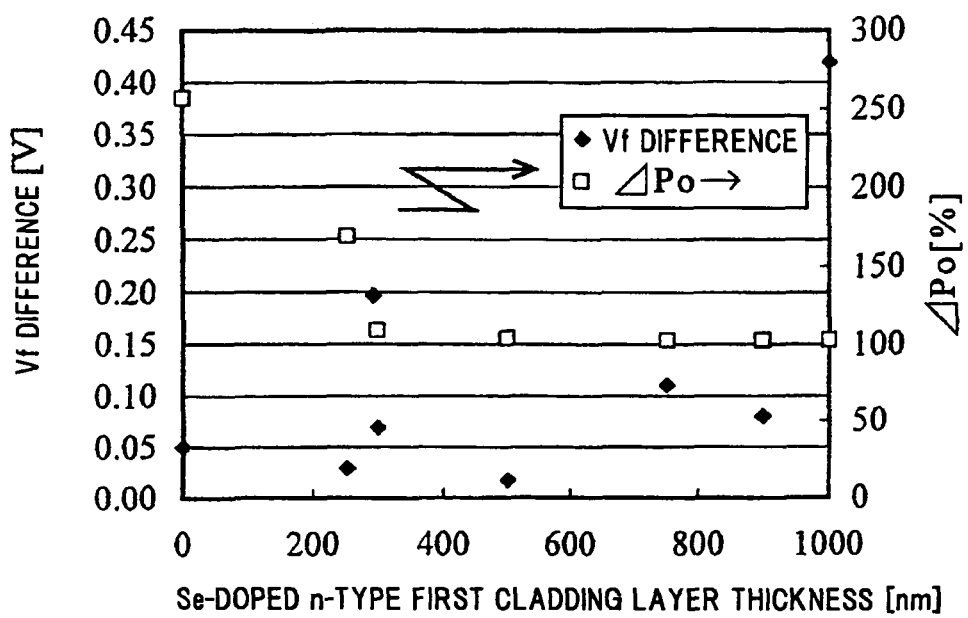
FIG. 8 is a graph showing the relationships between the thickness of a Se-doped n-type first cladding layer in an n-type cladding layer, and Vf difference, and ΔPo, in Example 3 of the second embodiment.

FIG. 8 shows the results of the Vf difference and ΔPo when varying the respective thicknesses of the Se-doped $(Al_{0.68}Ga_{0.32})_{0.51}In_{0.49}P$ layer (carrier concentration $7.5\times10^{17}$ cm$^{-3}$, thickness 500 nm), and thereover the Si-doped $(Al_{0.68}Ga_{0.32})_{0.51}In_{0.49}P$ layer (carrier concentration $7.5\times10^{17}$ cm$^{-3}$, thickness 500 nm) grown as the n-type cladding layer in Example 3 of the second embodiment, but with the total thickness of both held at 1000 nm.

As shown in FIG. 8, in this structure, the Vf difference and ΔPo both are good when the thickness of the Se-doped $(Al_{0.68}Ga_{0.32})_{0.51}In_{0.49}P$ layer (carrier concentration $7.5\times10^{17}$ cm$^{-3}$) is not less than 250 nm and not more than 900 nm. From this result, it may be assumed that when in Example 4 of the second embodiment with the Te-doped layer and the Si-doped layer stacked therein, similar results are obtained.

Also, when the total thickness of the n-type cladding layer is not less than 750 nm and not more than 1200 nm, and when the Se-doped layer thickness is not less than 25% and not more than 90% of the total thickness of the n-type cladding layer, the in-plane distribution of Vf, reliability, and the other properties are good, as in Examples 1-5.

Although in the above Examples the light-emitting layer is the undoped AlGaInP single layer (650 nm), it may have an MQW structure.

From above, it is found that doping the n-type cladding layer with 2 or more n-type impurities including Si can inhibit the operating voltage at the perimeter of the wafer from being increased, enhance the in-plane homogeneity of wafer properties, permit use of the entire wafer surface, ensure stable light-emitting power and permit high-reliability light-emitting device production.

Although the invention has been described with respect to the above embodiments, the above embodiments are not intended to limit the appended claims. Also, it should be noted that not all the combinations of the features described in the above embodiments are essential to the means for solving the problems of the invention.

What is claimed is:

1. A light-emitting device epitaxial wafer, comprising:
an n-type substrate;
an n-type cladding layer stacked on the n-type substrate;
a light-emitting layer comprising a quantum well structure stacked on the n-type cladding layer; and
a p-type cladding layer stacked on the light-emitting layer,
wherein the n-type cladding layer comprises an epitaxial layer doped with a mixture of 2 or more n-type dopants including Si, and is not less than 250 nm and not more than 750 nm in thickness, and
wherein the epitaxial layer doped with a mixture of 2 or more n-type dopants including Si is formed to gradually increase the Si concentration from its n-type substrate side to light-emitting layer side, while gradually decreasing the concentration of the n-type dopant other than Si from the n-type substrate side to light-emitting layer side.

2. A light-emitting device produced using the light-emitting device epitaxial wafer according to claim 1.

3. A light-emitting device epitaxial wafer, comprising:
an n-type substrate;
an n-type cladding layer stacked on the n-type substrate;
a light-emitting layer comprising a quantum well structure stacked on the n-type cladding layer; and
a p-type cladding layer stacked on the light-emitting layer,
wherein the n-type cladding layer comprises an epitaxial layer doped with a mixture of 2 or more n-type dopants including Si, and is not less than 250 nm and not more than 750 nm in thickness, and
wherein the n-type dopants of the epitaxial layer doped with a mixture of 2 or more n-type dopants including Si are Si and Se, and the amount of Se doping is not less than 20% and not more than 80% relative to the total amount of Si and Se doping.

4. A light-emitting device epitaxial wafer, comprising:
an n-type substrate;
an n-type cladding layer stacked on the n-type substrate;
a light-emitting layer comprising a quantum well structure stacked on the n-type cladding layer; and
a p-type cladding layer stacked on the light-emitting layer,
wherein the n-type cladding layer comprises an n-type first cladding layer doped with an n-type dopant other than Si, and an n-type second cladding layer doped with Si as an n-type dopant, and the entire thickness of the n-type cladding layer is not less than 250 nm and not more than 750 nm, and
wherein the n-type dopant of the n-type first cladding layer is Se, and the Se-doped n-type first cladding layer has not less than 25% and not more than 80% of the total thickness of the n-type cladding layer.

5. A light-emitting device epitaxial wafer, comprising:
an n-type substrate;
an n-type cladding layer stacked on the n-type substrate;
a light-emitting layer comprising a quantum well structure stacked on the n-type cladding layer; and
a p-type cladding layer stacked on the light-emitting layer,
wherein the n-type cladding layer comprises an epitaxial layer doped with a mixture of 2 or more n-type dopants including Si, and is not less than 250 nm and not more than 750 nm in thickness, and
wherein the light-emitting layer with the quantum well structure comprises an AlGaInP ($0 \leq$ Al mixed crystal ratio $\leq 0.35$) well layer, and the well layer thickness is not less than 2.5 nm and not more than 6.5 nm, and the carrier concentration in the n-type cladding layer is not less than $2.5\times10^{17}$ cm$^{-3}$ and not more than $7.0\times10^{17}$ cm$^{-3}$.

6. A light-emitting device epitaxial wafer, comprising:
an n-type substrate;
an n-type cladding layer stacked on the n-type substrate;
a light-emitting layer stacked on the n-type cladding layer; and
a p-type cladding layer stacked on the light-emitting layer,
wherein the n-type cladding layer comprises 2 or more n-type impurities including Si, the n-type cladding layer comprises an epitaxial layer doped with a mixture of 2 or more n-type impurities including Si, and the n-type impurities are Si and Se, and the amount of Se doping is not less than 20% and not more than 80% relative to the total amount of Si and Se doping.

7. A light-emitting device produced using the light-emitting device epitaxial wafer according to claim 6.

8. A light-emitting device epitaxial wafer, comprising:

an n-type substrate;

an n-type cladding layer stacked on the n-type substrate;

a light-emitting layer stacked on the n-type cladding layer; and a p-type cladding layer stacked on the light-emitting layer, wherein the n-type cladding layer comprises 2 or more n-type impurities including Si, the n-type cladding layer comprises an epitaxial layer doped with a mixture of 2 or more n-type impurities including Si, the n-type impurities are Si and Se, and the amount of Se doping is not less than 20% and not more than 80% relative to the total amount of Si and Se doping, and the Si concentration in the n-type cladding layer is gradually increased from its n-type substrate side, while the concentration of the n-type impurity other than Si in the n-type cladding layer is gradually decreased from the n-type substrate side, and the carrier concentration in the n-type cladding layer is not less than $3.5 \times 10^{17}$ cm$^{-3}$ and not more than $8.0 \times 10^{17}$ cm$^{-3}$.

\* \* \* \* \*

UNITED STATES PATENT AND TRADEMARK OFFICE
CERTIFICATE OF CORRECTION

PATENT NO. : 8,421,056 B2
APPLICATION NO. : 12/656674
DATED : April 16, 2013
INVENTOR(S) : Takashi Takeuchi et al.

Page 1 of 1

It is certified that error appears in the above-identified patent and that said Letters Patent is hereby corrected as shown below:

Title Page, Item (75) Inventors should read:

--(75)  Inventors:  1) Takashi Takeuchi
                    2) Taichiroo KONNO--.

Signed and Sealed this
Sixteenth Day of July, 2013

Teresa Stanek Rea
*Acting Director of the United States Patent and Trademark Office*